(12) United States Patent
Ishihara

(10) Patent No.: US 9,454,032 B2
(45) Date of Patent: Sep. 27, 2016

(54) DISPLAY DEVICE

(71) Applicant: Japan Display Inc., Tokyo (JP)

(72) Inventor: Keiichiro Ishihara, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/739,776

(22) Filed: Jun. 15, 2015

(65) Prior Publication Data

US 2015/0362793 A1    Dec. 17, 2015

(30) Foreign Application Priority Data

Jun. 16, 2014 (JP) ................... 2014-123120

(51) Int. Cl.
  *G02F 1/1335* (2006.01)
  *H01L 51/52* (2006.01)
  *H01L 27/32* (2006.01)

(52) U.S. Cl.
  CPC ............ *G02F 1/133512* (2013.01); *G02F 2001/133519* (2013.01); *H01L 27/322* (2013.01); *H01L 51/5275* (2013.01)

(58) Field of Classification Search
  CPC .................. G02F 1/1335; H01L 51/52
  See application file for complete search history.

(56) References Cited

U.S. PATENT DOCUMENTS

| 2006/0105251 | A1* | 5/2006 | Hwang | G02B 5/285 430/7 |
| 2012/0147303 | A1* | 6/2012 | Yamada | G02B 1/11 349/96 |
| 2012/0262654 | A1 | 10/2012 | Moriwaki | |
| 2014/0231790 | A1* | 8/2014 | Fujino | H01L 27/322 257/40 |
| 2015/0042933 | A1* | 2/2015 | Ueki | G02B 5/0242 349/108 |

FOREIGN PATENT DOCUMENTS

JP    2012226032 A    11/2012

* cited by examiner

*Primary Examiner* — Timothy L Rude
(74) *Attorney, Agent, or Firm* — Typha IP LLC

(57) ABSTRACT

In order to prevent light leakage between adjacent pixels or prevent color mixture, a liquid crystal display device includes: a TFT substrate having a pixel in which a pixel electrode and a TFT are formed; a counter substrate in which a color filter is formed corresponding to the pixel, a black matrix is formed between each of the color filters, and an overcoat film is formed so as to cover the color filter; and a liquid crystal sandwiched between the TFT substrate to the counter substrate. When seen from a direction perpendicular to the main surface of the counter substrate, an insertion material with a refractive index different from the refractive index of the overcoat film is formed in the layer of the overcoat film at a position corresponding to the black matrix. The refractive index of the insertion material is different from the refractive index of the liquid crystal.

12 Claims, 16 Drawing Sheets

DISPLAY DEVICE

CLAIM OF PRIORITY

The present application claims priority from Japanese Patent Application JP 2014-123120 filed on Jun. 16, 2014, the content of which is hereby incorporated by reference into this application.

BACKGROUND OF THE INVENTION

1. Field of the Invention

The present invention relates to a display device, and more particularly, to a display device capable of reducing light leakage to adjacent pixels and thus preventing the so-called color mixture even on a high definition screen.

2. Description of the Related Art

In a liquid crystal display device, pixels each having a pixel electrode, a thin film transistor (TFT), and the like are arranged in a matrix form in a TFT substrate, and a counter substrate is provided opposite the TFT substrate. Further, a liquid crystal is sandwiched between the TFT substrate and the counter substrate. Then, an image is formed by controlling the transmittance of light in each pixel by the liquid crystal molecules.

Liquid crystal display devices are flat and lightweight and have been applied in various fields. Medium and small sized liquid crystal display devices are widely used in mobile phones, digital still cameras (DSC), and tablet display devices. In the medium and small sized liquid crystal display device, the screen is required to be high definition. One pixel is configured by three RGB pixels. In recent years, a definition of 50 µm has been required for the pitch of one pixel. In this case, the width of each of the RGB pixels is about 17 microns.

When the center of the pixel electrode is deviated from the center of the color filter, a part of the light that has passed through the pixel passes through the color filter of the adjacent pixel. In other words, the so-called color mixture occurs. Although the influence of such a color mixture is small when the pixel pitch is large, the degradation of the color purity is significant when the definition is high with smaller pixel pitch.

Patent Document 1 (Japanese Patent Application Laid-Open No. 2012-226032) describes a configuration in which a translucent material with a refractive index different from a color filter is provided between the color filters, to prevent color mixture due to light from the outside by taking advantage of the refractive index between the color filters and the translucent material.

SUMMARY OF THE INVENTION

The problem of color mixture in the conventional example will be described with reference to FIGS. 16 and 17. FIG. 16 is a schematic cross-sectional view of a liquid crystal display device according to a conventional example. In FIG. 16, a TFT layer 101 is formed in a TFT substrate 100. A TFT is a device to switch a video signal to a pixel electrode 104, which is formed by a gate electrode, a gate insulating film, a semiconductor layer, a source electrode, a drain electrode, and the like. These layers are represented as the TFT layer 101.

An insulating layer 103 that also functions as a passivation film is formed on the TFT layer 101. Then, a pixel electrode 104 is formed on the insulating layer 103. If the liquid crystal display device is an IPS type, a counter electrode is formed below or above the pixel electrode 104 with an insulating film between them. In FIG. 16, the counter electrode formed below the insulating film is omitted. However, it is also possible to configure that the counter electrode is formed above the insulating film and the pixel electrode is formed below the insulating film.

A counter substrate 200 is provided above the TFT substrate 100 with a liquid crystal 500 between them. In the counter substrate 200, color filters 202R, 202G, 203G for red pixel (R), green pixel (G), and blue pixel (B) are formed, respectively, at positions each corresponding to the pixel electrode 104 of each pixel. A black matrix 201 is formed as a light shielding film between each of the pixels. An overcoat film 203 is formed so as to cover the color filter 202. The role of the overcoat film 203 is to smooth irregularities due to the color filter 202, and to prevent the color filter 202 from directly contacting the liquid crystal 500.

A backlight is provided below the TFT substrate 100, in which an image is formed by controlling a back light 400 by the liquid crystal 500 for each pixel. The light from the backlight is not collimated. For this reason, the light is diffused in the direction of the main surface of the TFT substrate 100 and the like. This state is schematically represented by an elliptical area 300 in FIG. 16. In FIG. 16, it is depicted that the light changes its course by the liquid crystal 500, but this is because this is a schematic diagram. Actually, the light diffusion and the like occurs due to refraction between different layers formed in the TFT substrate 100 or in the counter substrate 200, or due to reflection, diffraction, and the like caused by the wiring or other equipment.

FIG. 16 is schematic diagram when there is no alignment deviation between the TFT substrate 100 and the counter substrate 200. In other words, a pixel boundary 150 on the TFT substrate side, which is indicated by the dashed line in FIG. 16, matches a pixel boundary on the counter substrate side. Note that the pixel boundary on the counter substrate side is the boundary between each of the color filters. In this case, a back light 410 towards the adjacent pixel is shielded by the black matrix 201 formed on the pixel boundary so as to prevent color mixture. In FIG. 16, when focusing on the red pixel (R), of the light 400 from the backlight, the light toward the adjacent blue pixel (B) is represented by 410, and the reflected light that is reflected between the liquid crystal 500 and the overcoat film 203 is represented by 420.

On the other hand, FIG. 17 is a cross-sectional view in which there is an alignment deviation between the TFT substrate 100 and the counter substrate 200. In FIG. 17, the pixel boundary 150 on the side of the TFT substrate 100 is deviated from a pixel boundary 250 on the side of the counter substrate 200. In FIG. 17, the light diffused to the adjacent pixel is not completely shielded by the black matrix 201. As a result, the light passes through the color filter 202 of the adjacent pixel, which deteriorates the color purity or is visually recognized as light leakage in the adjacent pixel. FIG. 17 shows the state in which the light 410, which is expected to allow the red pixel (R) to emit light, changes its course to the left direction and enters the area of the blue pixel (B), resulting in a color mixture area 310 generated in the blue pixel (B).

The color mixture due to light leakage to the adjacent pixel is not a significant problem when the pixel pitch is large. However, the color mixture is visible when the screen is high definition and the pixel pitch is reduced. An object of the present invention is to prevent such a light leakage to adjacent pixels and to reduce color mixture.

The present invention has been made to overcome the above problems. Specific means for solving the problems are as follows:

(1) There is provided a liquid crystal display device including: a TFT substrate having a pixel in which a pixel electrode and a TFT are formed; a counter substrate in which a color filter is formed corresponding to the pixel, a black matrix is formed between each of the color filters, and an overcoat film is formed so as to cover the color filter; and a liquid crystal sandwiched between the TFT substrate and a counter substrate. When seen from the direction perpendicular to the main surface of the counter substrate, an insertion material with a refractive index different from the refractive index of the overcoat film is formed in the layer of the overcoat film at a position corresponding to the black matrix. The refractive index of the insertion material is different from the refractive index of the liquid crystal.

(2) In the liquid crystal display device described in (1), the refractive index is larger than the refractive index of the liquid crystal.

(3) In the liquid crystal display device described in (2), the width w of the insertion material is w=bw±1 μm with respect to the width bw of the corresponding black matrix.

(4) In the liquid crystal display device described in (2), the insertion material is an inorganic material.

(5) In the liquid crystal display device described in (1), the refractive index of the insertion material is smaller than the refractive material of the liquid crystal.

(6) In the liquid crystal display device described in (5), the width w of the insertion material is w=bw±1 μm with respect to the width bw of the corresponding black matrix.

(7) In the liquid crystal display device described in (5), the insertion material is an inorganic material.

(8) There is provided a liquid crystal display device including a TFT substrate having a pixel in which a pixel electrode and a TFT are formed. In the TFT substrate, a color filter is formed corresponding to the pixel, a black matrix is formed between each of the color filters, and an overcoat film is formed so as to cover the color filter. Further, a liquid crystal is sandwiched between the TFT substrate and a counter substrate. When seen from the direction perpendicular to the main surface of the counter substrate, an insertion material with a refractive index different from the refractive index of the overcoat film is formed in the layer of the overcoat film at a position corresponding to the black matrix. The refractive index of the insertion material is different from the refractive index of the liquid crystal.

(9) There is provided a liquid crystal display device including a TFT substrate having a pixel in which a pixel electrode and a TFT are formed. In the TFT substrate, a color filter is formed corresponding to the pixel, a black matrix is formed between each of the color filters, an overcoat film is formed so as to cover the color filter, and another layer is formed so as to cover the overcoat film. Further, a liquid crystal is sandwiched between the TFT substrate and a counter substrate. When seen from the direction perpendicular to the main surface of the counter substrate, an insertion material with a refractive index different from the refractive index of the overcoat film is formed in the layer of the overcoat film at a position corresponding to the black matrix. The refractive matrix of the insertion material is different from the refractive index of the other layer.

(10) There is provided an organic EL display device in which a protective film is formed so as to cover an organic EL layer formed in a first substrate. An overcoat film is formed on the protective film. A color filter is formed on the overcoat film. Further, a black matrix is formed between each of the color filters. When seen from the direction perpendicular to the main surface of the first substrate, an insertion material with a refractive index different from the refractive index of the overcoat film is formed in the layer of the overcoat film at a position corresponding to the black matrix. The refractive index of the insertion material is different from the refractive index of the protective film.

(11) There is provided an organic EL display device in which a protective film is formed so as to cover an organic EL layer in a first substrate. In a second layer, a color filter is formed in a second layer, a black matrix formed between each of the color filters, and an overcoat film is formed so as to cover the color filter. Further, an insertion material with a refractive index different from the refractive index of the overcoat film is formed in the layer of the overcoat film at a position corresponding to the black matrix when seen from the direction perpendicular to the main surface of the second substrate. The refractive index of the insertion material is different from the refractive index of the protective film.

(12) In the organic EL display device described in (11), the protective film is an adhesive material for bonding the first substrate to the second substrate.

According to the present invention, it is possible to reduce light leakage to an adjacent pixel in a display device, so that the degree of color mixture can be reduced.

DETAILED DESCRIPTION OF THE PREFERRED EMBODIMENTS

Hereinafter, an example of the configuration of an in-plane switching (IPS) mode liquid crystal display device will be descried. However, the present invention is not limited to the IPS mode. Further, although in the following description it is assumed that a color filter is formed in a counter substrate, the present invention is also applicable to the case in which the color filter is formed on the side of the TFT substrate. In addition, the present invention is not limited to the liquid crystal display device, and is also applicable to organic EL display devices.

Figure 1:
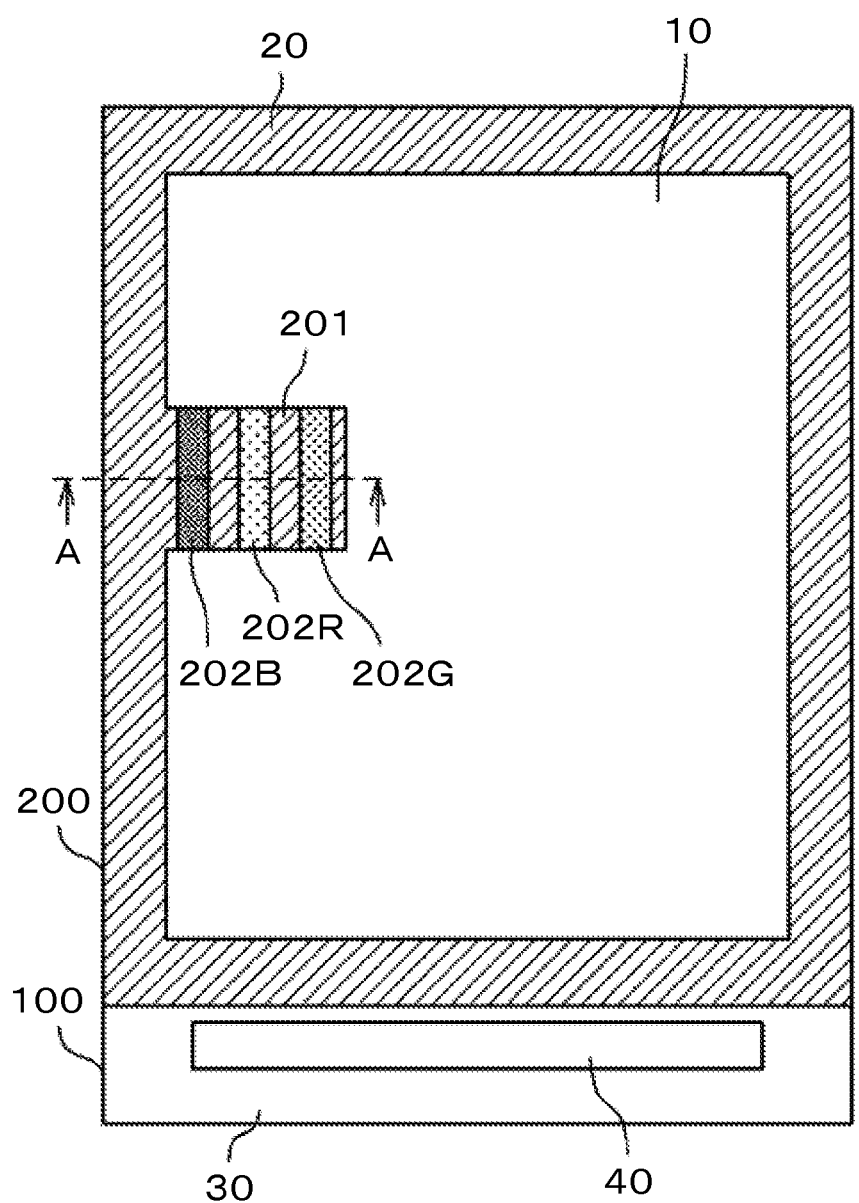
FIG. 1 is a plan view of a liquid crystal display device to which the present invention is applied.

FIG. 1 is a plan view of a liquid crystal display device for mobile phone, which shows an example of a liquid crystal display device to which the present invention is applied. In FIG. 1, a TFT substrate 100 and a counter substrate 200, which are opposite each other, are bonded with a sealing material formed in the periphery. A liquid crystal is sandwiched between the TFT substrate 100 and the counter substrate 200. The TFT substrate 100 is made larger than the counter substrate 200, in which the portion of the TFT substrate 100 that does not overlap the counter substrate 200 is a terminal portion 30. An IC chip 40 including a driver circuit is mounted in the terminal portion 30.

In FIG. 1, a color filter 202R, a green color filter 202G, and a blue color filter 202B are formed in stripe in the vertical direction, which correspond to a red pixel (R), a green pixel (G), and a blue pixel (B), respectively. A black matrix 201 is formed between each of the red color filter 202R, the green color filter 202G, and the blue color filter (B), respectively. A light shielding film as a black matrix is formed in the periphery of a display area 10. The sealing material is formed in a frame area 20 to bond the TFT substrate and the counter electrode to each other.

Figure 2:
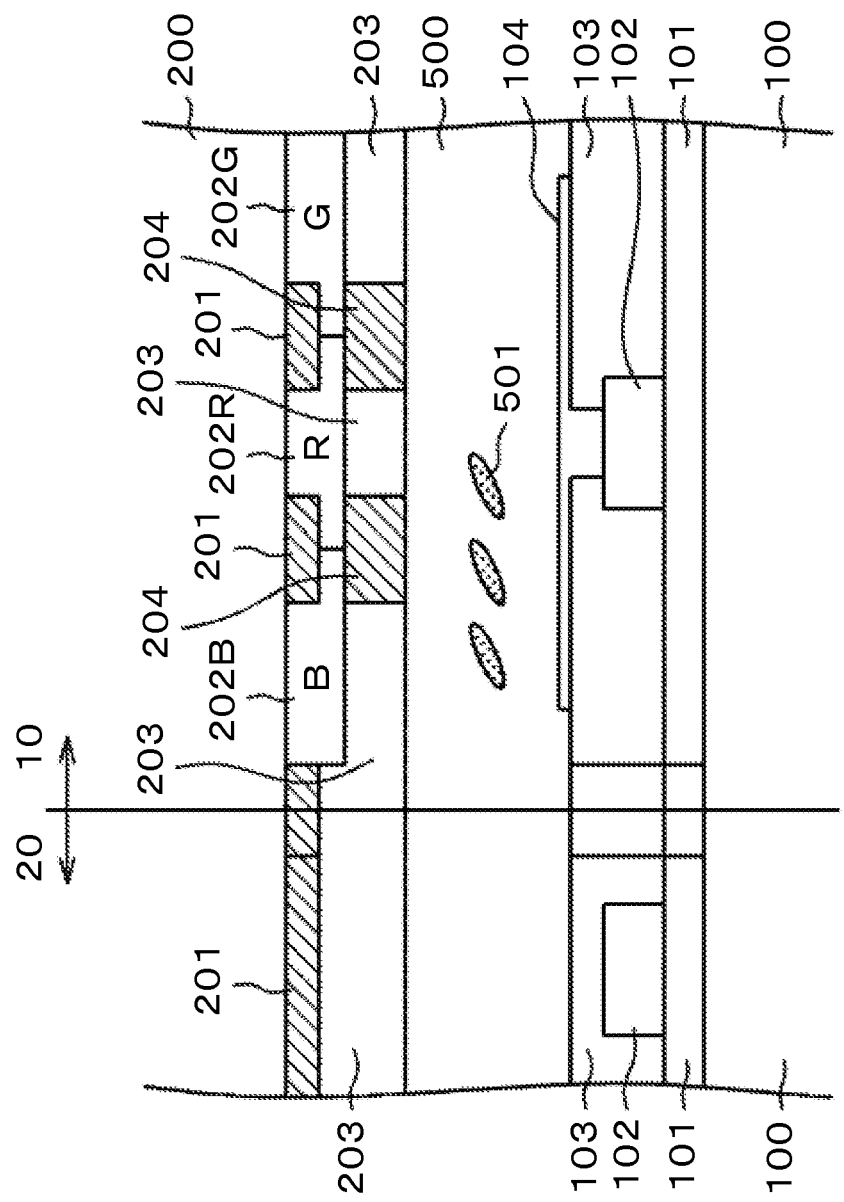
FIG. 2 is a cross-sectional view along line A-A in FIG. 1.

FIG. 2 is a schematic view showing an A-A cross section of FIG. 1. In FIG. 2, a TFT layer 101 is formed on the TFT substrate 100 which is formed of glass, resin or other suitable material. A TFT is formed by a gate electrode, a gate insulating film, a semiconductor layer, and the like, and these layers are represented as the TFT layer 101. On the TFT layer 101, for example, an electrode connected to the TFT, a source electrode, a drain electrode, and a wiring layer 102 of video signal lines or other lines are formed.

An insulating film 103 such as a passivation film, which is formed by an inorganic insulating film or an organic insulating film, is formed so as to cover the TFT layer 101 and the wiring layer 102. Then, a pixel electrode 104 formed by a transparent conductive film, such as ITO, is formed on the insulating film 103. In FIG. 2, the counter electrode is omitted. FIG. 2 is a schematic view when the TFT is a top gate type in which the semiconductor layer is formed of polysilicon. In the case of a bottom gate type TFT in which the semiconductor layer is formed by a-Si, the wiring layer 102 may be included in the TFT layer 101.

The counter substrate 200 of glass or resin is formed opposite the TFT substrate 100. The liquid crystal 500 is sandwiched between the TFT substrate 100 and the counter substrate 200. Reference numeral 501 schematically represents a liquid crystal molecule. The black matrix 201 is formed as the light shielding film on the side of the liquid crystal 500 of the counter substrate 200. Then, the color filter 202 is formed between each of the black matricies 201. The overcoat film 203 is formed so as to cover the color filter 202.

A feature of the present invention is that a substance 204 with a refractive index different from the overcoat film 203 is provided below the black matrix 201. By providing the substance 204 whose refractive index is different from the overcoat film 203, it is possible to reduce the amount of light obliquely incident on the overcoat film 203 that enters the adjacent pixel. As a result, the degree of color mixture can be reduced.

The light from the backlight enters the overcoat film through the liquid crystal, so that it is possible to consider the following two cases: using a substance with a refractive index larger than the refractive index of the liquid crystal; and using a substance with a refractive index smaller than the refractive index of the liquid crystal. Hereinafter, an example in which the refractive index of the material different from the overcoat film is smaller than the refractive index of the liquid crystal will be described as a first embodiment. Then, an example in which the refractive index of the material different from the overcoat film is larger than the liquid crystal will be described as a second embodiment.

First Embodiment

Figure 3:
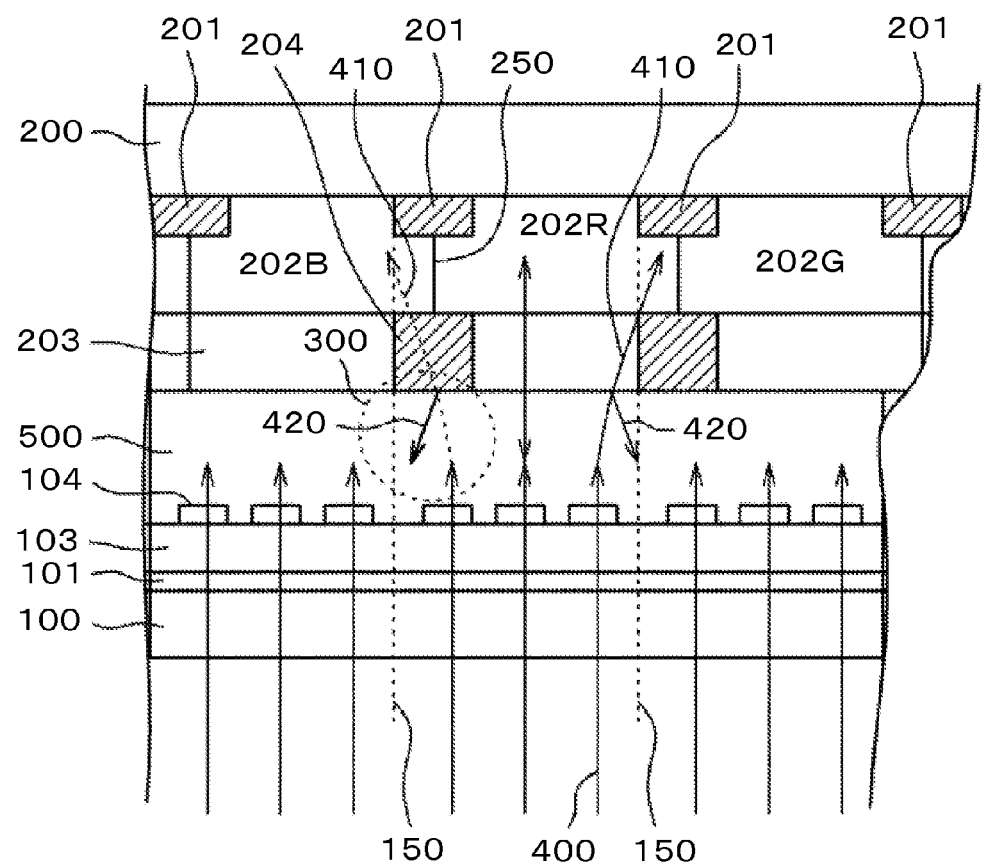
FIG. 3 is a cross-sectional view of a liquid crystal display device according to a first embodiment.

FIG. 3 is a schematic view of an example of the present invention in which the refractive index of the material 204 (hereinafter referred to as the insertion material 204) different from the overcoat film is smaller than the refractive index of the liquid crystal 500. In FIG. 3, the TFT layer 101 is provided on the TFT substrate 100. Further, the insulating layer 103 is provided on the TFT layer 101. Then, the pixel electrode 104 is formed on the insulating layer 103. In FIG. 3, the pixel electrode 104 is an electrode having three comb teeth per pixel. On the side of the TFT substrate 100 shown in FIG. 3, the region between dashed lines 150 corresponds to one pixel.

In FIG. 3, the counter substrate 200 is provided opposite the TFT substrate 100 with the liquid crystal 500 between them. On the side of the liquid crystal 500 of the counter substrate 200, the red color filter 202R, the green color filter 202G, and the blue color filter 202B are formed, in which a black matrix is formed at the boundary between each of the color filters 202. Further, the overcoat film 203 is formed so as to cover the color filter 202. However, the insertion material 204 is formed in a portion corresponding to the black matrix of the layer of the overcoat film 203.

In FIG. 3, the TFT substrate 100 and the counter substrate 200 are bonded together around the periphery by means of the sealing material. However, an alignment deviation occurs in the bonding between the TFT substrate 100 and the counter substrate 200. This alignment deviation can be a cause of color mixture. FIG. 3 is a cross-sectional view showing the operation of the present invention when the alignment deviation between the TFT substrate 100 and the counter substrate 200 is assumed to be one half the width of the black matrix.

In FIG. 3, the backlight is provided on the back surface of the TFT substrate 100, and a back light 400 is perpendicularly incident on the main surface of the TFT substrate 100. Although the back light 400 is not collimated, FIG. 3 schematically shows this light. Some of the back light incident on the TFT substrate changes its course to an oblique direction due to refraction, dispersion and the like.

In FIG. 3, there are three cases with respect to the light incident on the red pixel (R). That is, the light travels in a straight line, or the direction of the light is changed to the blue pixel (B), or the direction of the light is changed to the green pixel (G). Of the three cases, there is no problem of color mixture when the light travels in a straight line. In FIG. 3, the counter substrate 200 is deviated to the right with respect to the TFT substrate 100. Thus, the light refracted from the red pixel (R) to the side of the blue pixel (B) will create a problem of color mixture. On the other hand, the light refracted from the red pixel (R) to the green pixel (G) does not cause the problem of color mixture.

In FIG. 3, the light refracted from the red pixel (R) to the blue pixel (B) is indicated by a dashed arrow 410. In the conventional example, the problem of color mixture arises because the light, which is expected to pass only through the red pixel (R), passes through the blue pixel (B) due to the alignment deviation between the TFT substrate 100 and the counter substrate 200. In the present embodiment, the insertion material 204, which is the material with a refractive index smaller than the refractive index of the overcoat film 203, is provided below the black matrix 201 to increase the difference in the refractive index from the liquid crystal 500, in order to increase the amount of the light (420) reflected from the material 204 which is different from the overcoat film. In this way, the amount of light passing through the blue color filter 202B from the side of the red pixel (R) is reduced to reduce the color mixture.

Note that in the actual liquid crystal display device, an alignment film is provided between the liquid crystal 500 and the overcoat film 203 or the insertion material 204. However, the influence of the refractive index of the alignment film is ignored in this evaluation. The result of such an evaluation is ever the same. The following is a numerical evaluation of the principle to show the effect in the present embodiment. Equation 1 shows a proportion I of the light reflected at the interface between a first substance and a second substance, in which the first substrate (refractive index NO) and the second substance (refractive index N1) are brought into contact with each other.

Equation 1

$$I = \left(\frac{N_0 - N_1}{N_0 + N_1}\right)^2 \quad (1)$$

As a conventional example, it is assumed that the refractive index of the liquid crystal 500 is 1.6 and the refractive index of the overcoat film 203 is 1.6. In this case, the reflection at the interface between the overcoat film 203 and the liquid crystal 500 is zero, so that the light traveling from the red pixel (R) to the blue pixel (B) is large. On the other hand, as in the case of the present embodiment, when the refractive index of the insertion material 204 is set to be smaller than the refractive index of the overcoat film 203 or than the refractive index of the liquid crystal 500, and when the refractive index is set to 1, the reflection factor at the interface with the liquid crystal 500 is 0.05, in which the refractive index of the liquid crystal 500 is set to 1.6 similarly to the conventional example. Thus, the light traveling from the red pixel (R) to the blue pixel (B) is reduced by this amount. As a result, the amount of color mixture can be reduced.

This state is represented by the area surrounded by the dashed line in FIG. 3. In other words, in the red pixel (R), it is assumed that the light from the backlight is refracted, reflected, or diffused as indicated by the dashed arrow, and changes the direction to the blue pixel (B) as indicated by the arrow. Because of the presence of the insertion material 204, the light is reflected to the side of the liquid crystal 500 as indicated by the thick solid arrow. Thus, the light traveling to the blue pixel (B) is reduced by this amount, so that the color mixture with the blue pixel (B) is reduced.

Note that in FIG. 3, in the red pixel (R), both the light traveling straight and the light traveling toward the green pixel (G) are also reflected on the overcoat film. The reason why the reflection occurs is that the refractive index of the liquid crystal and the refractive index of the overcoat film are not exactly the same. In this case, the reflection is smaller than the reflection of the light traveling toward the blue pixel (B), and is indicated by the thin arrow.

Figure 4:
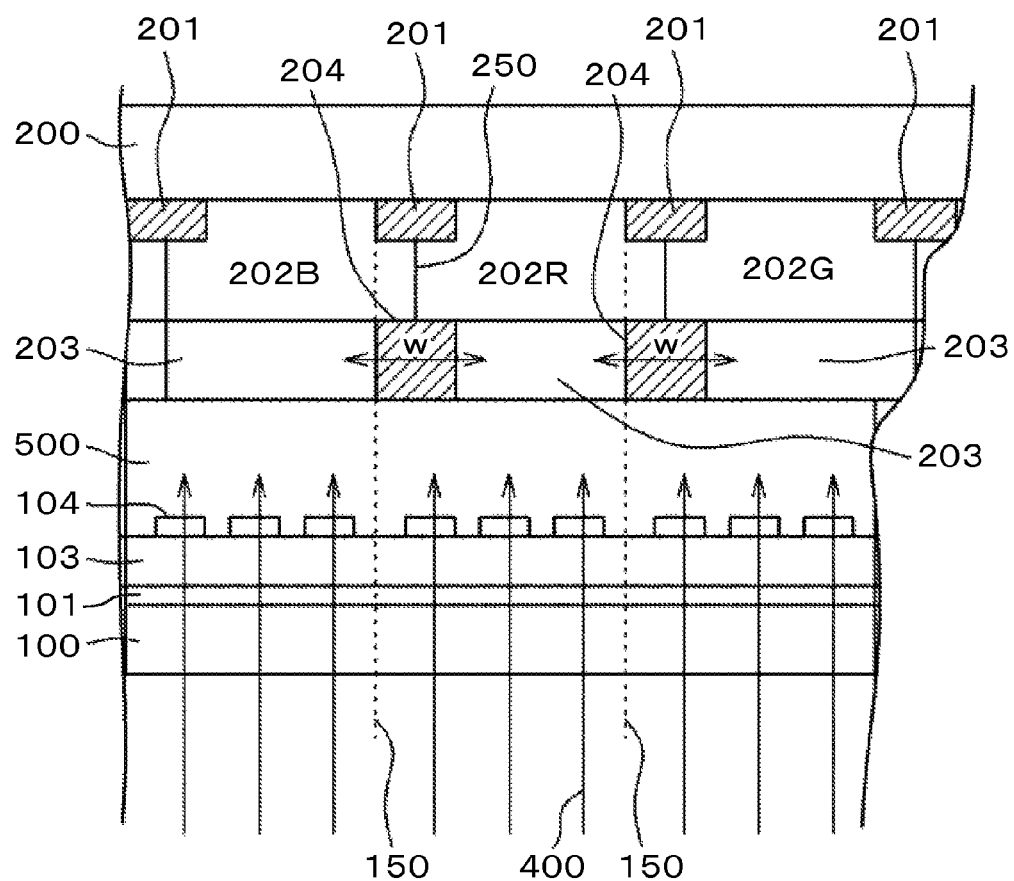
FIG. 4 is a cross-sectional view showing another example of the liquid crystal display device according to the first embodiment.

FIG. 3 is an evaluation when the width of the insertion material 204 is the same as the width of the black matrix 201. However, the same effect can be expected when the width of the insertion material 204 is smaller or larger than the width of the black matrix 201. FIG. 4 is an evaluation when the width of the insertion material is both larger and smaller by 1 μm than the width of the black matrix. FIG. 4 shows the same configuration as in FIG. 3, and shows that the width w of the insertion material 204 may change with respect to the width of the black matrix 201.

Figure 5:
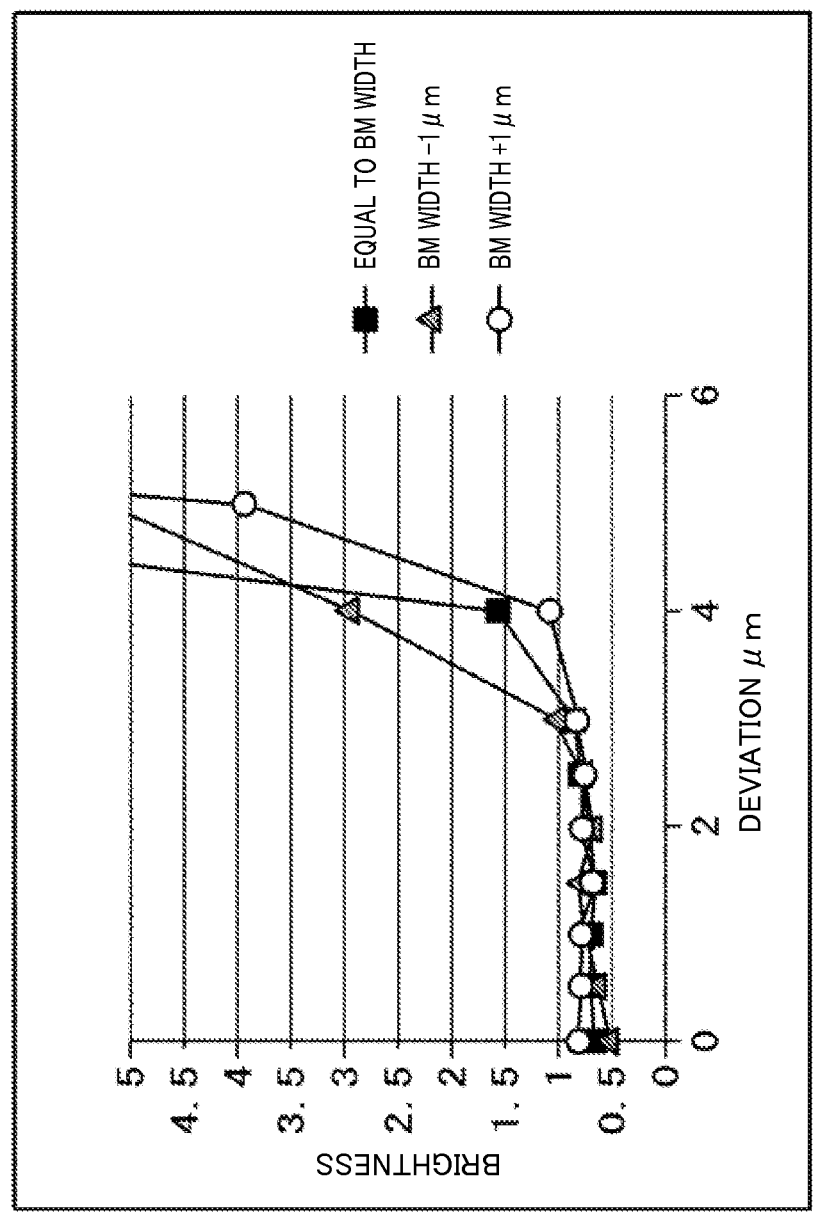
FIG. 5 is a graph showing the width of an insertion material as well as the degree of color mixture according to the first embodiment.

FIG. 5 is a graph showing the degree of color mixture when there is a deviation between the TFT substrate 100 and the counter substrate 200 in the configuration shown in FIG. 4. The horizontal axis of FIG. 5 represents the deviation between the TFT substrate 100 and the counter substrate 200, and the vertical axis represents the amount of light entering the blue pixel (B) from the red pixel (R). The smaller this light, the smaller the color mixture is. Note that it is assumed that the width of each pixel is 17 μm in FIG. 5.

In FIG. 5, the color mixture hardly increases until the deviation between the TFT substrate 100 and the counter substrate 200 is 3 μm. When the width of the insertion material 204 is smaller by 1 μm than the width of the black matrix 201, the brightness starts increasing when the deviation exceeds 3 μm. On the other hand, when the width of the insertion material 204 is the same as or greater by 1 μm than the width of the black matrix 201, the brightness starts rapidly increasing in an area in which the deviation between the TFT substrate 100 and the counter substrate exceeds about 4 μm. In either case, according to the present embodiment, it is possible to reduce the amount of color mixture until the deviation between the TFT substrate 100 and the counter substrate 200 is about 3 as long as the width of the insertion material 204 is within plus/minus 1 μm.

Figure 6:
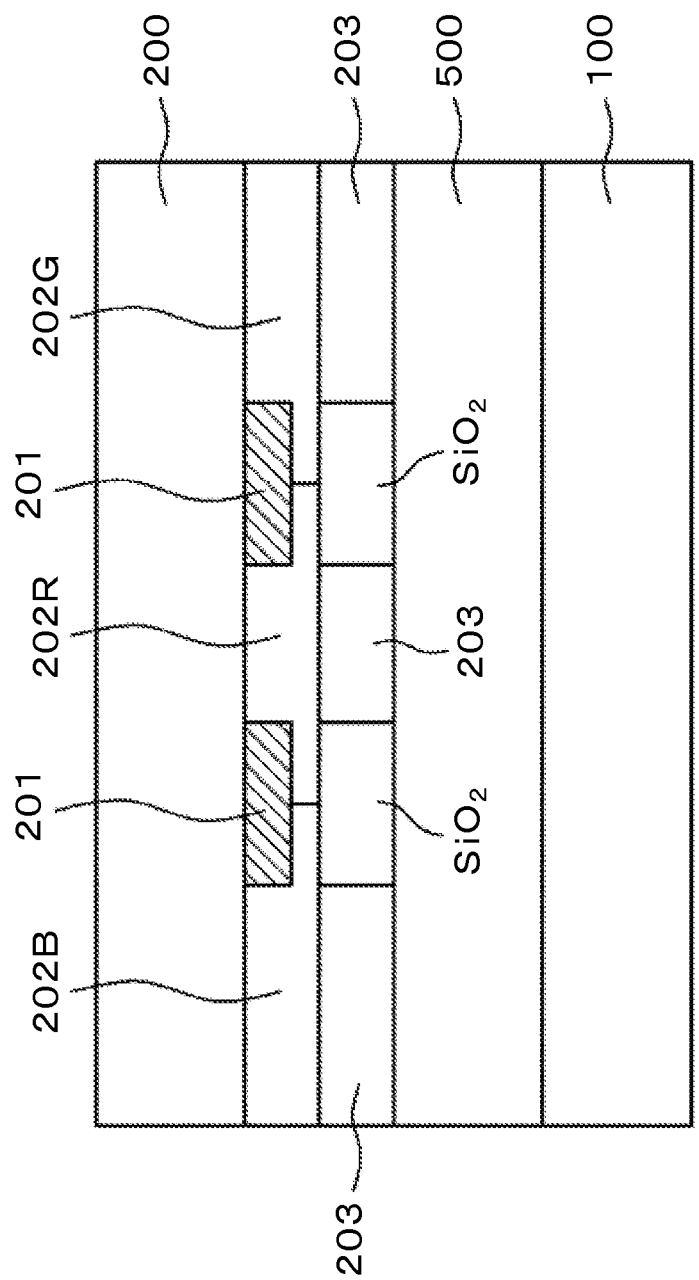
FIG. 6 is a cross-sectional view showing a specific configuration of the first embodiment.

FIG. 6 is a specific example of achieving the present embodiment. $SiO_2$ is used as the insertion material 204. The refractive index of $SiO_2$ is about 1.5. Thus, when the refractive index of the liquid crystal is set to 1.6 s reflection occurs at the interface with $SiO_2$ and it is possible to reduce the degree of color mixture. On the other hand, when a material with a refractive index smaller than the refractive index of $SiO_2$ which is about 1.5, is used as the insertion material 204, it is possible to further increase the reflection at the interface with the insertion material 204.

In the above description, the color mixture when the counter substrate 200 is deviated, for example, to the right with respect to the TFT substrate 100 is evaluated. In other words, the color mixture of the blue pixel (B) is evaluated.

The similar phenomenon occurs also in the color mixture of the green pixel (G) with respect to the red pixel (R), as well as the color mixture of the blue pixel (B) with respect to the green pixel (G). On the other hand, when the counter substrate is deviated to the left with respect to the TFT substrate, it is possible to adopt the same description as the above description in the color mixture of the blue pixel (B) with respect to the red pixel (R).

Second Embodiment

Figure 7:
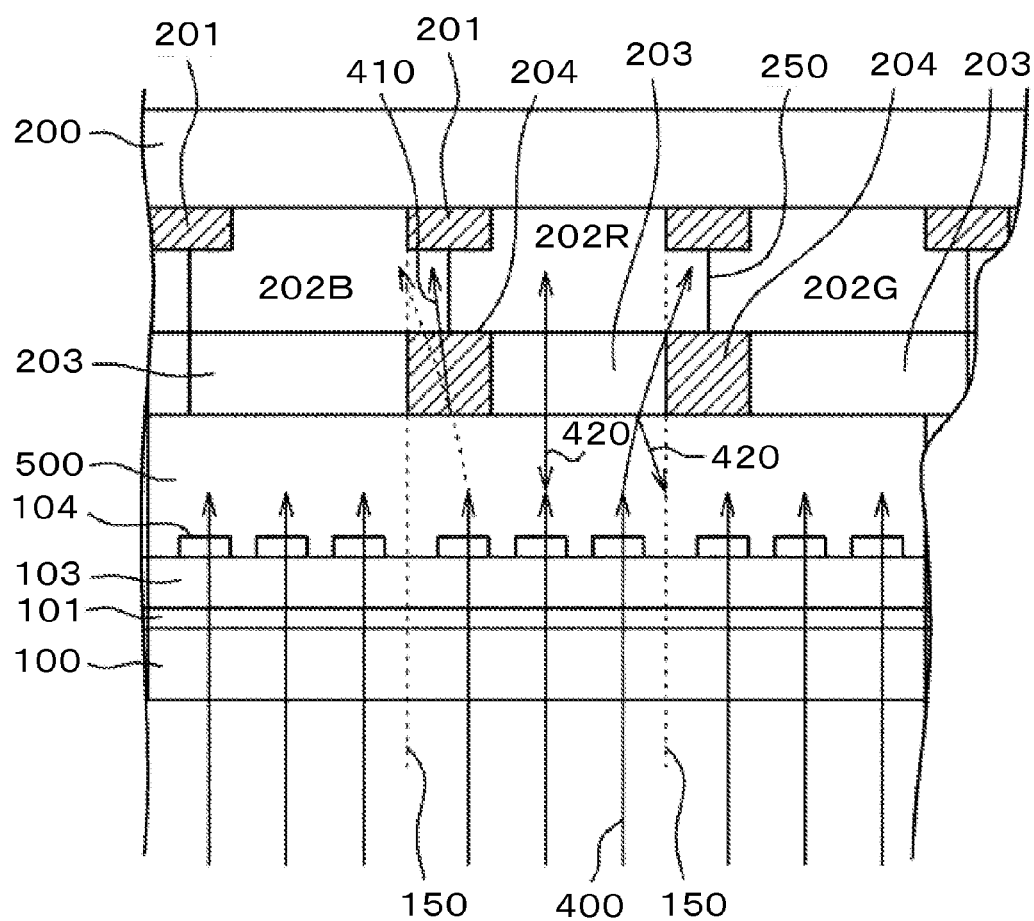
FIG. 7 is a cross-sectional view of a liquid crystal display device according to a second embodiment.

Contrary to the first embodiment, this embodiment is designed to prevent color mixture by providing the insertion material 204, whose refractive index is larger than the overcoat film 204 or than the liquid crystal 500, between the overcoat films 203 below the black matrix 201. This principle is shown in FIG. 7. FIG. 7 is the same as FIG. 3, except a material with a refractive index larger than the overcoat film 203 or the liquid crystal 500 is used as the insertion material 204. Thus, the detailed description of the configuration will be omitted.

In FIG. 7, the back light 400 is perpendicularly incident on the TFT substrate 100. The light is bent in a different direction within the liquid crystal display panel due to refraction, reflection and the like. In FIG. 7, a description will be given of the light bent in the left direction in the red pixel (R) as indicated by the dashed line. The light bent in the left direction as indicated by the dashed line enters the blue pixel (B) and then creates color mixture.

In the present embodiment, the overcoat 203 in the lower layer, which corresponds to the black matrix 201, is replaced by the insertion material 204 with a refractive index larger than the overcoat film 203 or the liquid crystal 500. Thus, the light is refracted by the insertion material and travels to the black matrix 201, instead of entering the blue matrix (B). As a result, the color mixture is reduced.

Figure 8:
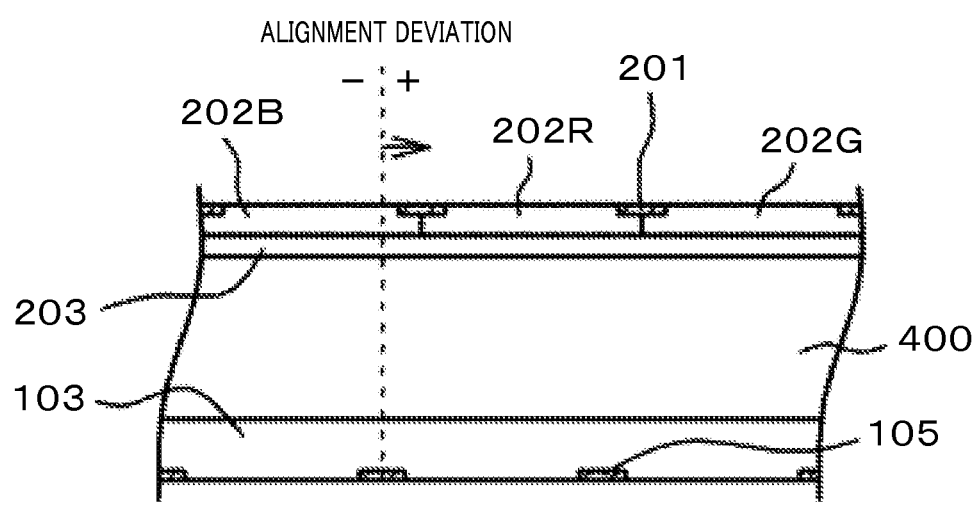
FIG. 8 is a schematic cross-sectional view in which there is a deviation between a TFT substrate and a counter substrate.

FIG. 8 is a schematic cross-sectional view in which the counter substrate 200 is deviated in the right direction with respect to the TFT substrate 100. In FIG. 8, image signal lines 105 are provided in the TFT substrate 100, on which the insulating layer 103 is formed. Then, the counter substrate 200 is provided opposite the TFT substrate with the liquid crystal 500 between them. The black matrix 201, the color filters 202R, 202G, 202B, and the overcoat film 203 are formed in the counter substrate 200. If there is no alignment deviation between the TFT substrate 100 and the counter substrate 200, the center of the video signal line matches the center of the black matrix. However, in FIG. 8, the counter substrate 200 is deviated in the right direction with respect to the TFT substrate 100, in which, for example, the color mixture of red pixel (R) is likely to occur with respect to the blue pixel (B).

Figure 9:
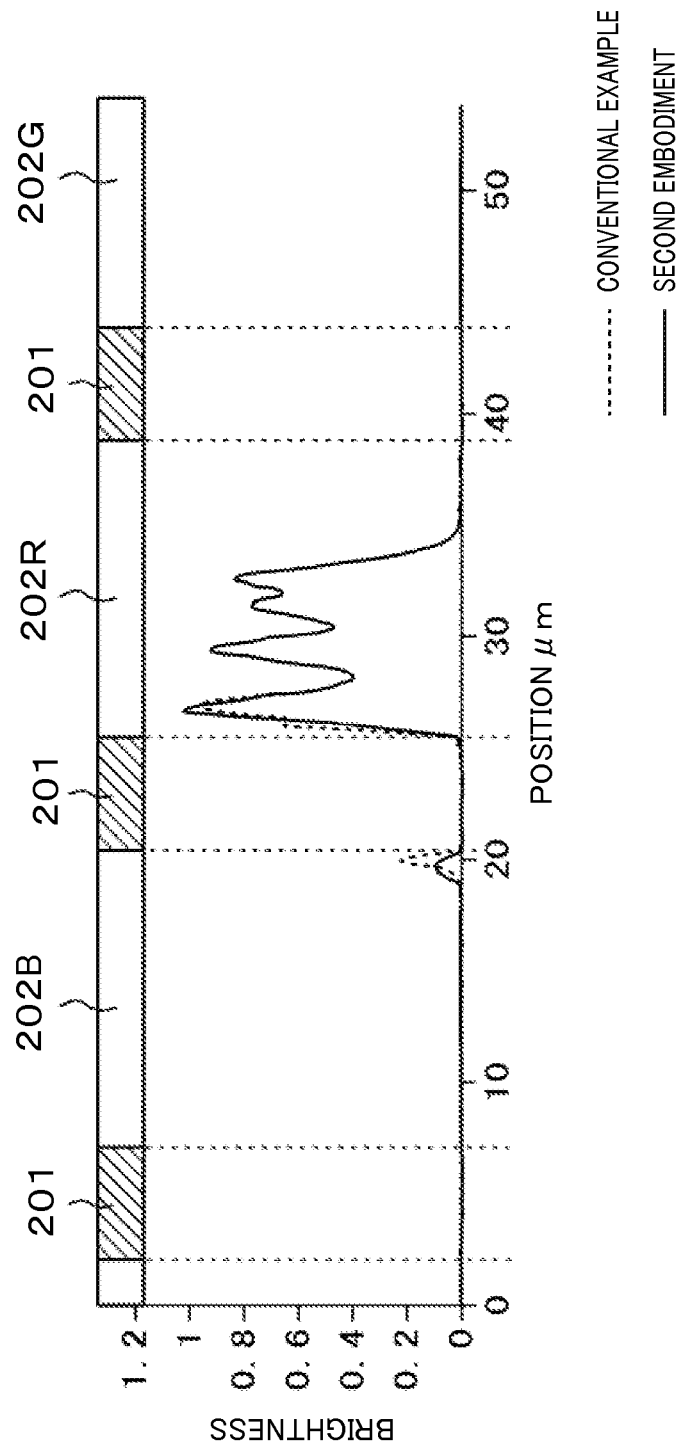
FIG. 9 is a graph showing the level of the color mixture when the deviation between the TFT substrate and the counter electrode is 5 μm.

In FIG. 8, when only the red pixel (R) is lit and other colors are black, the amount of light the blue pixel (B) emits can be defined as color mixture. FIG. 9 shows the evaluation of the amount of light in each of the pixels when the counter substrate 200 is deviated by 5 μm from the TFT substrate 100. In FIG. 9, the blue pixel (B), the red pixel (R), and the green pixel (G) are arranged from the left with the black matrix 201 between each of the pixels.

In the graph shown in FIG. 9, the horizontal axis represents the position corresponding to each pixel, and the vertical axis represents the amount of light passing through the pixel. Because only the red pixel (R) is lit, the light of only the red pixel (R) is expected to be observed. However, since the counter substrate is deviated in the right direction with respect to the TFT substrate, some light leaks to the blue pixel (B). The color mixture can be evaluated by this amount of light of the blue pixel (B).

In FIG. 9, the dashed line shows a conventional example, and the solid line shows an example according to the second embodiment. As shown in FIG. 9, in the present embodiment, the amount of light leaking from the red pixel (R) to the blue pixel (B) is one half or less as compared to the conventional example. In other words, according to the present embodiment, it is possible to reduce the degree of color mixture to one half or less as compared to the conventional example.

Figure 10:
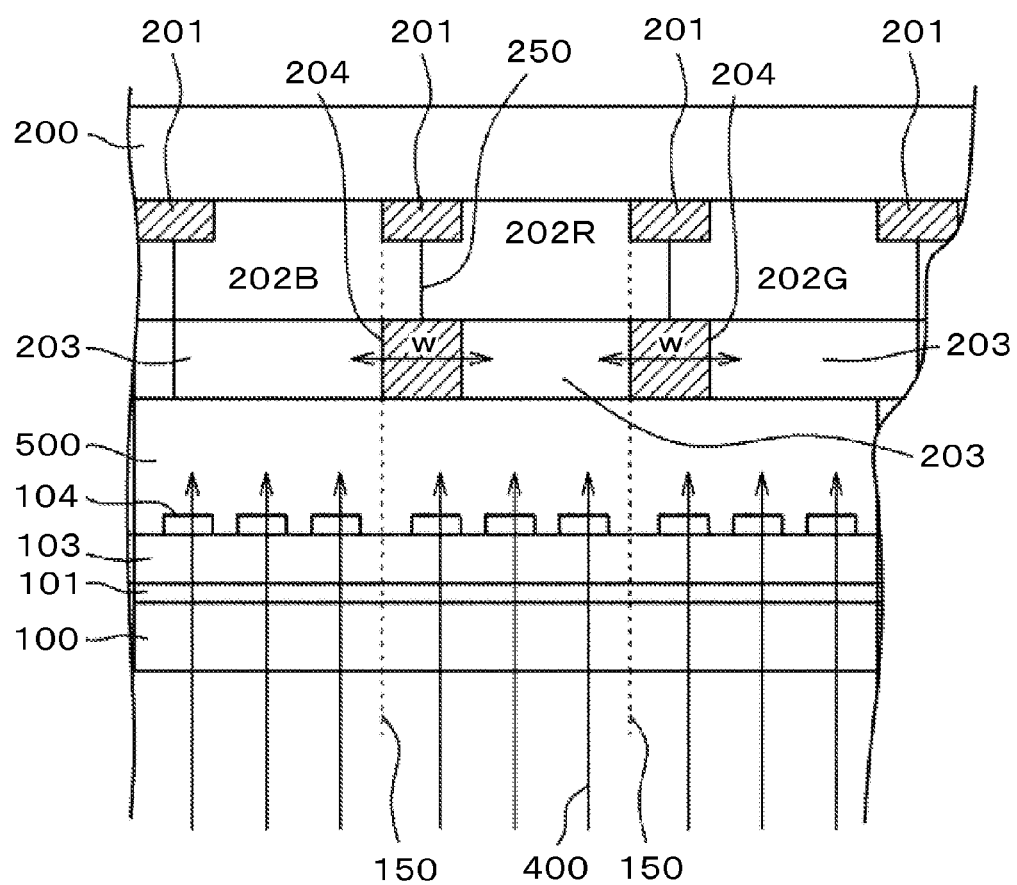
FIG. 10 is a cross-sectional view showing another example of the liquid crystal display device according to the second embodiment.
Figure 11:
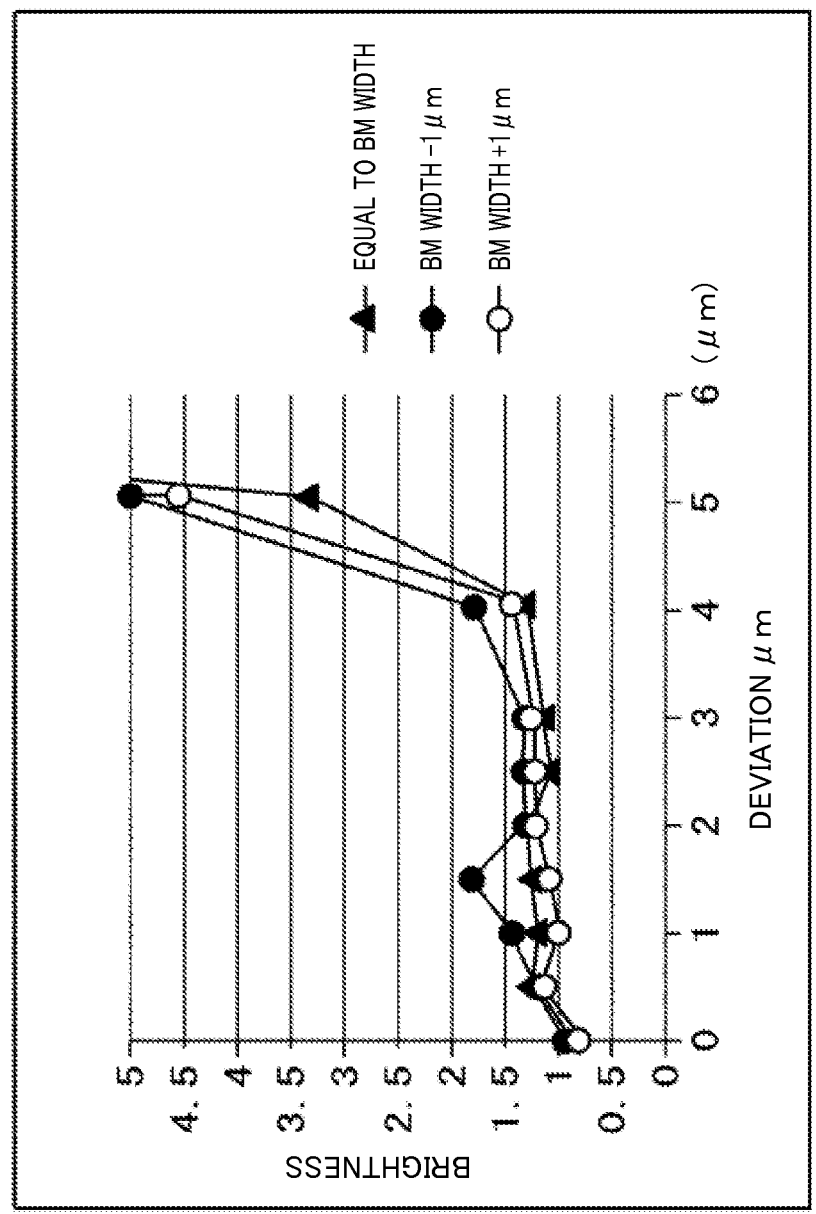
FIG. 11 is a graph showing the width of the insertion material as well as the degree of color mixture according to the second embodiment.

FIG. 10 is a cross-sectional view showing a schematic view when the width w of the insertion material 204 provided below the black matrix is changed. The arrow depicted in the insertion material 204 shows when the width of the insertion material 204 is changed. The other configurations are the same as those in FIG. 7. FIG. 11 is a graph showing an evaluation of color mixture when the width of the insertion material 204 is changed by plus/minus 1 μm with respect to the width of the black matrix 201, and when there is alignment deviation in the counter substrate 200 with respect to the TFT substrate 100.

In FIG. 11, the horizontal axis is the deviation between the counter substrate 200 and the TFT substrate 100 in the unit of μm. The vertical axis is the amount of color mixture in an arbitrary unit, which is the comparison value. In FIG. 11, there is no significant color mixture until the deviation between the TFT substrate 100 and the counter substrate 200 is about 3 μm. However, the amount of color mixture slightly increases when the deviation is about 4 μm. When the width of the insertion material 204 is smaller by 1 μm than the width of the black matrix 201, the degree of color mixture is slightly larger than the other cases. However, this is within the range of error. From FIG. 11, it can be said that the degree of color mixture is hardly degraded until the deviation in the counter substrate 200 with respect to the TFT substrate 100 is about 3 μm, as long as the width of the insertion material 204 is about plus/minus 1 μm with respect to the width of the black matrix 201.

Figure 12:
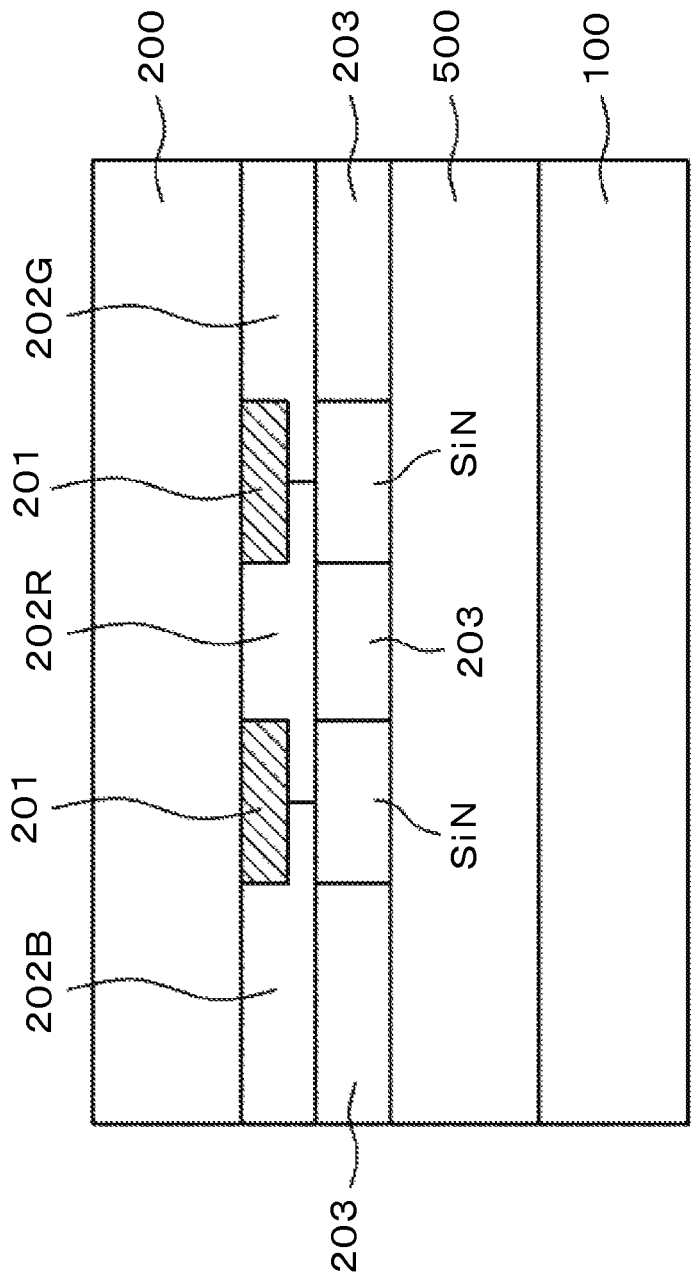
FIG. 12 is a cross-sectional view showing a specific configuration of the second embodiment.

FIG. 12 is a schematic cross-sectional view showing the specific material configuration in the present embodiment. FIG. 12 is an example of using SiN as the material with a refractive index larger than the overcoat film 203 or the liquid crystal 500. The refractive index of SiN is about 1.7, which is larger than the refractive index of the liquid crystal or the general overcoat film material. In FIG. 12, the counter substrate 200 is provided above the TFT substrate with the liquid crystal 500 between them. The black matrix 201 and the color filters 202R, 202G, 202B are formed in the counter substrate 200. Then, the overcoat film 203 is formed so as to cover the color filter 202. However, SiN is formed in the region corresponding to the black matrix 201 in the layer of the overcoat film 203.

Figure 13:
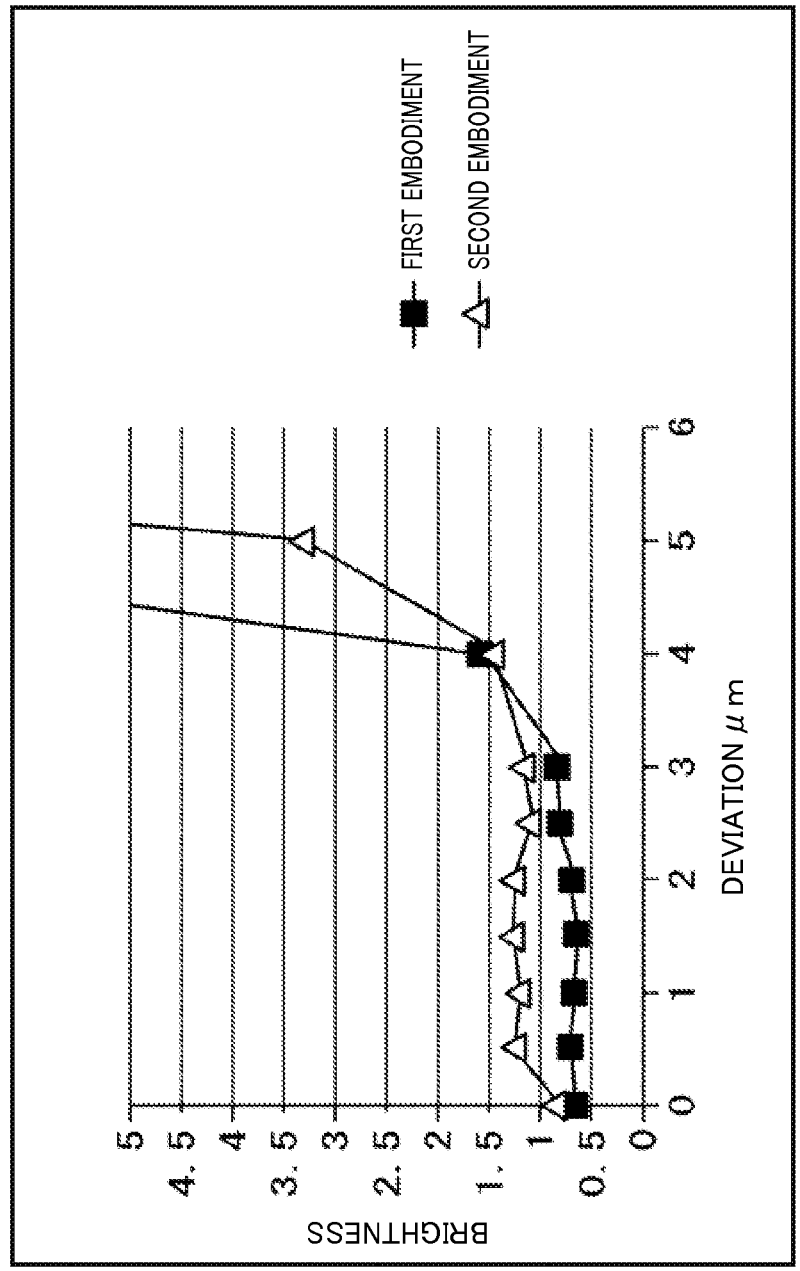
FIG. 13 is a graph showing the degree of color mixture in which there is a deviation between the TFT substrate and the counter substrate, according to the first and second embodiments.

FIG. 13 is a diagram of an evaluation of the amount of deviation between the substrates as well as the degree of color mixture in both the first and second embodiments. In FIG. 13, the horizontal axis is the deviation between the TFT substrate and the counter substrate in the unit of μm. The vertical axis is the degree of color mixture in an arbitrary unit, which is the comparison value. Both in the first and second embodiments, it is assumed that the width of the insertion material 204 is the same as the width of the black matrix 201.

In FIG. 13, the color mixture hardly increases until the deviation between the substrates is about 3 μm both in the first and second embodiments. The color mixture slightly increases when the deviation is between 3 and 4 μm. The color mixture starts rapidly increasing when the deviation exceeds 4 µm. In particular, the degree of the increase in color mixture is large in the configuration of the first embodiment when the deviation exceeds 4 µm. On the other hand, when the deviation is 3 µm or less, it can be said that the degree of color mixture is slightly smaller in the first embodiment, which is within the range of error. As described above, it is possible to prevent the color mixture from substantially increasing both in the first and second embodiments, as long as the deviation between the TFT substrate 100 and the counter substrate 200 is 3 µm or less.

Third Embodiment

The above description has focused on the liquid crystal display panel in which the color filters 202 are formed in the counter substrate 200, and TFTs and pixel electrodes are formed in the TFT substrate 100. Meanwhile, there is also a configuration in which the color filters are formed on the side of the TFT substrate, in order to eliminate the deviation between the pixels formed in the TFT substrate 100 and the color filters formed in the counter substrate 200. This configuration is called Color Filter On Array (COA).

COA is a technology capable of eliminating the deviation between the pixel electrode 104 and the color filter 202 due to alignment deviation between the TFT substrate 100 and the counter substrate 200. However, also in the case of COA, the color filter 202, the pixel electrode 104, and the like are formed by photolithography, so that a deviation between the pixel electrode 104 and the color filter 202 occurs due to the misalignment in the positioning of the photoresist mask. Thus, the present invention shown in the first and second embodiments is also applicable to such a COA type liquid crystal display device.

Figure 14:
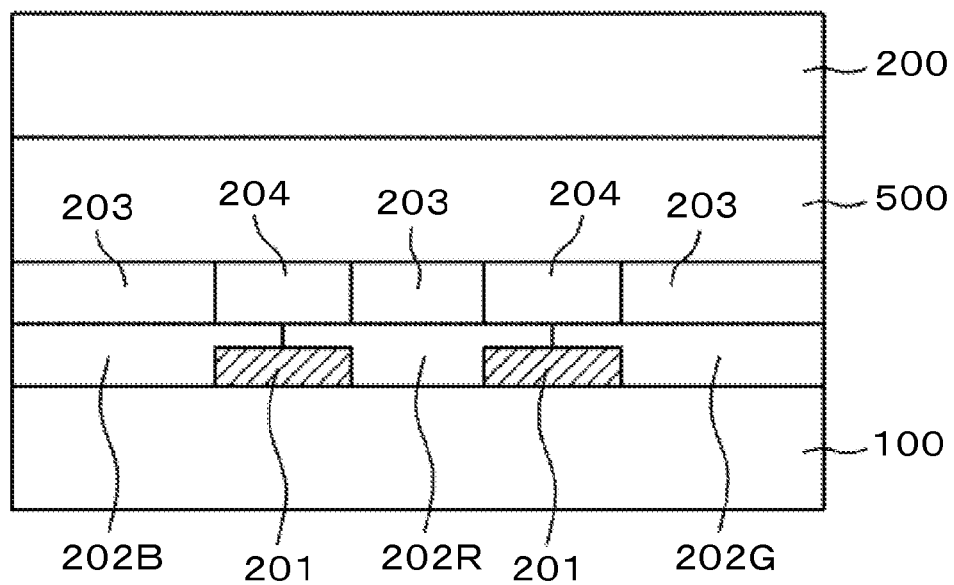
FIG. 14 is a cross-sectional view in which the present invention is applied to COA.

FIG. 14 is a schematic cross-sectional view in which the present invention is applied to a COA type liquid crystal display device. In FIG. 14, the black matrix 201, the red color filter 202R, the green color filter 202G, and the blue color filter 202B are formed on the side of the TFT substrate 100, on which the overcoat film 203 is formed. In the overcoat film 203, the insertion material 204 is provided at a position corresponding to the black matrix 201. The refractive index of the insertion material 204 is different from the refractive indices of the overcoat film 203 and the liquid crystal 500.

In this case, the effect is reversed when the refractive index of the insertion material 204 is set to larger than the refractive index of the liquid crystal 500 and when smaller than the refractive index of the liquid crystal 500, with respect to the first embodiment and the second embodiment. In other words, in the present embodiment, when the refractive index of the insertion material 204 is set to smaller than the refractive index of the liquid crystal 500, it operates to direct the light traveling in a direction oblique to the TFT substrate 100 toward the normal direction of the TFT substrate 100 by the refraction at the interface between the insertion material 204 and the liquid crystal 500.

On the other hand, when the refractive index of the insertion material 204 is set to larger than the refractive index of the liquid crystal 500, it is possible to further increase the amount of reflection at the interface between the insertion material 204 and the liquid crystal 500. Then, if (the refractive index of the insertion material)/(the refractive index of the liquid crystal) is the condition of occurrence of total reflection, the light entering other pixels can be reduced to zero. For this reason, the color mixture can be reduced to zero for the light at a predetermined angle or more to the normal direction of the TFT substrate 100.

In the configuration described above, it is assumed that the overcoat film 203 is brought into contact with the liquid crystal 500 in the TFT substrate 100. However, in the COA, the insulating layer, the pixel electrodes, and the like may be formed over the color filter 202 and the overcoat film 203. In such a case, the refractive index of the liquid crystal 500 described above can be replaced by the refractive index of the layer contacting the insertion material 204.

Note that FIG. 14 shows the case in which the black matrix 201 is formed on the side of the TFT substrate 100. However, there is also a case in which only the color filter 202 is formed on the side of the TFT substrate 100 and the black matrix 201 is formed on the counter substrate 200. Also in this configuration, the concept of the present embodiment can be applied.

Fourth Embodiment

Figure 15:
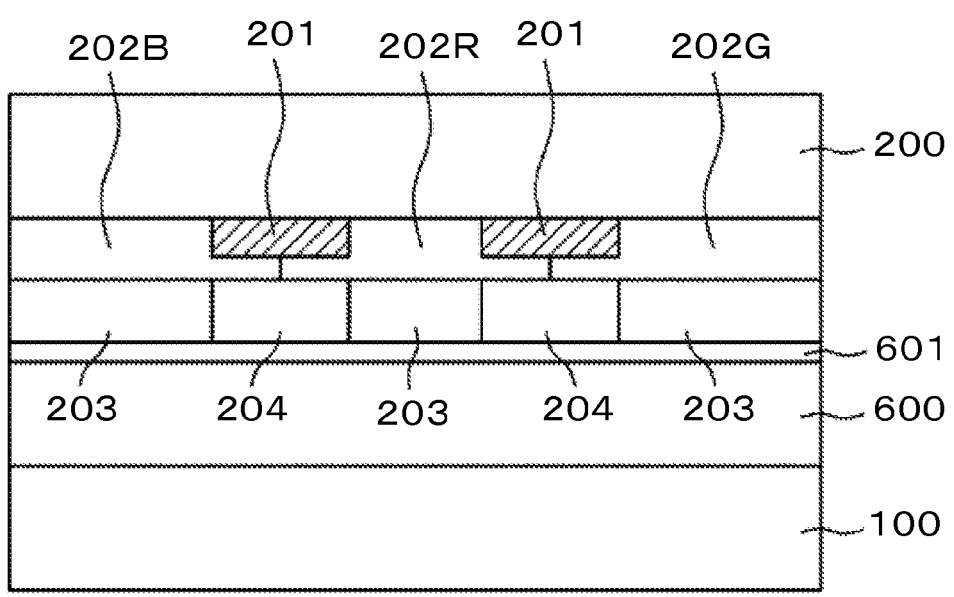
FIG. 15 is a cross-sectional view in which the present invention is applied to an organic EL display device.
Figure 16:
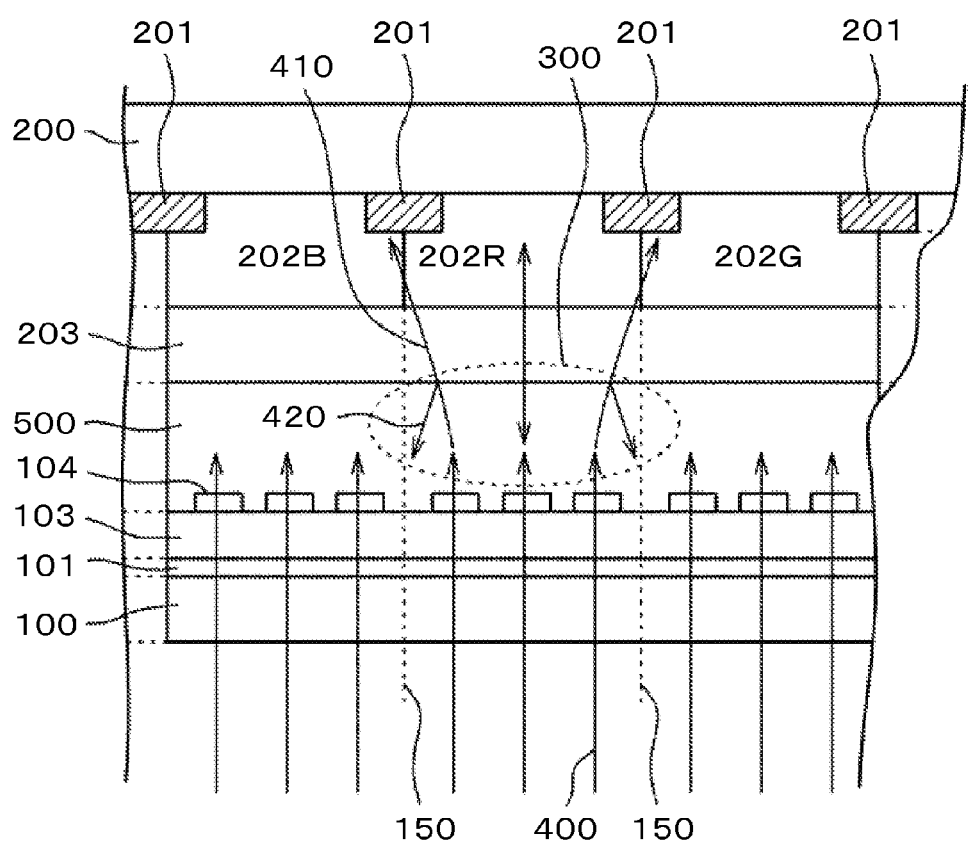
FIG. 16 is a cross-sectional view showing the path of the back light when there is no deviation between the TFT substrate and the counter substrate in a conventional example.
Figure 17:
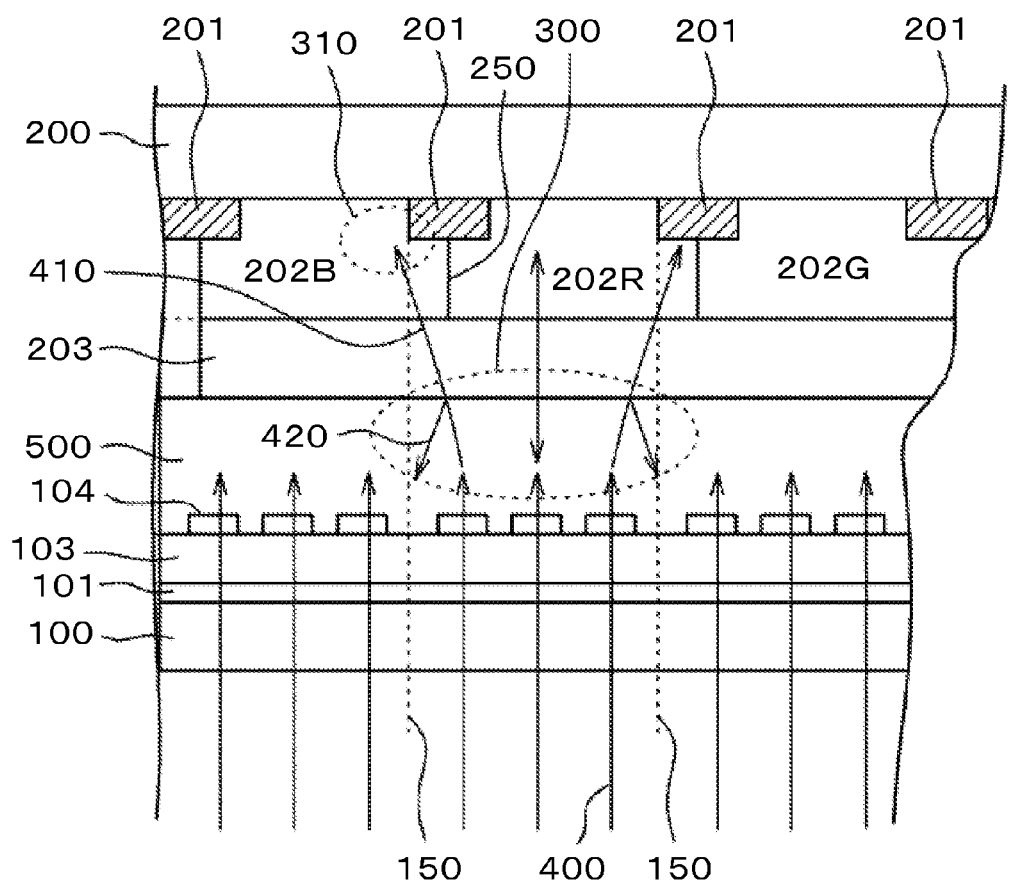
FIG. 17 is a cross-sectional view showing the path of the back light when there is a deviation between the TFT substrate and the counter substrate in the conventional example.

The first to third embodiments have described an example in which the present invention is applied to the liquid crystal display device. However, in addition to the liquid crystal display device, for example, the present invention can also be applied to an organic EL display device. There are various types of organic EL display devices, and one of them is to form a color image by color filters by using a white organic EL light emitting layer. FIG. 15 is a schematic cross-sectional view of this example.

In FIG. 15, an organic EL layer that emits white light is formed on the TFT substrate 100. Further, similar to the case of the liquid crystal display device, the color filters 202R, 202G, 202B are formed on the side of the counter substrate 200. Then, the black matrix 201 is formed between each of the color filters. Further, the overcoat film 203 is formed so as to cover the color filter 202. In FIG. 15, the insertion material 204 is provided in the layer of the overcoat film 203 corresponding to the black matrix 201, in place of the overcoat film 203.

An organic EL layer 600 in FIG. 15 is formed of different layers. Further, a protective layer 601, such as a passivation film, is formed on the organic EL layer to protect the organic EL layer 600. Further, an adhesive material is often used for the purpose of bonding the TFT substrate 100 to the counter substrate or in order to protect the organic EL layer 600. The adhesive material has a role as the protective layer 601.

By setting the refractive index of the insertion material 204 between the overcoat films 203 to be smaller than the refractive index of the protective layer 601 of the organic EL layer, it is possible to prevent color mixture by the same principle as that described in the first embodiment. Further, by setting the refractive index of the insertion material 204 between the overcoat films 203 to be larger than the refractive index of the protective layer 601 of the organic EL layer 600, it is possible to prevent color mixture by the same principle as that described in the second embodiment. Here, the protective layer is the layer contacting the overcoat film or the insertion material at the interface.

There is also the case in which the black matrix 201, the color filter 202, the overcoat film 203, the insertion material 204, and the like are formed on the side of the TFT substrate 100 in the organic EL display device. In this case also, the same effect as described above can be obtained as long as the protective layer 601, the overcoat film 203, the color filter 202, the black matrix 201, and the like are laminated on the organic EL layer 600 in the order as described above.

What is claimed is:

1. A liquid crystal display device comprising:
a TFT substrate having a pixel in which a pixel electrode and a TFT are formed;
a counter substrate in which a color filter is formed corresponding to the pixel, a black matrix is formed between each of the color filters, and an overcoat film is formed so as to cover the color filter; and
a liquid crystal is sandwiched between the TFT substrate and the counter substrate,
wherein, when seen from a direction perpendicular to the main surface of the counter substrate, an insertion material with a refractive index different from the refractive index of the overcoat film is formed in the layer of the overcoat film at a position corresponding to the black matrix,
wherein the refractive index of the insertion material is different from the refractive index of the liquid crystal.

2. A liquid crystal display device according to claim 1, wherein the refractive index of the insertion material is larger than the refractive index of the liquid crystal.

3. A liquid crystal display device according to claim 2, wherein the width w of the insertion material is w=bw±1 μm with respect to the width bw of the corresponding black matrix.

4. A liquid crystal display device according to claim 2, wherein the insertion material is an inorganic material.

5. A liquid crystal display device according to claim 1, wherein the refractive index of the insertion material is smaller than the refractive index of the liquid crystal.

6. A liquid crystal display device according to claim 5, wherein the width w of the insertion material is w=bw±1 μm with respect to the width bw of the corresponding black matrix.

7. A liquid crystal display device according to claim 5, wherein the insertion material is an inorganic material.

8. A liquid crystal display device comprising:
a TFT substrate having a pixel in which a pixel electrode and a TFT are formed, a color filter is formed corresponding to the pixel, a black matrix is formed between each of the color filters, and an overcoat film is formed so as to cover the color filer;
a counter substrate; and
a liquid crystal sandwiched between the TFT substrate and the counter substrate,
wherein, when seen from a direction perpendicular to the main surface of the counter substrate, an insertion material with a refractive index different from the refractive index of the overcoat film is formed in the layer of the overcoat film at a position corresponding to the black matrix,
wherein the refractive index of the insertion material is different from the refractive index of the liquid crystal.

9. A liquid crystal display device comprising:
a TFT substrate having a pixel in which a pixel electrode and a TFT are formed, a color filter is formed corresponding to the pixel, a black matrix is formed between each of the color filters, an overcoat film is formed so as to cover the color filter, and another layer is formed so as to cover the overcoat film;
a counter substrate; and
a liquid crystal sandwiched between the TFT substrate and the counter substrate,
wherein, when seen from a direction perpendicular to the main surface of the counter substrate, an insertion material with a refractive index different from the refractive index of the overcoat film is formed in the layer of the overcoat film at a position corresponding to the black matrix,
wherein the refractive index of the insertion material is different from the refractive index of the other layer.

10. An organic EL display device comprising:
a protective film formed so as to cover an organic EL layer formed in a first substrate;
an overcoat film formed on the protective film;
a color filter formed on the overcoat film; and
a black matrix formed between each of the color filters,
wherein, when seen from a direction perpendicular to the main surface of the first substrate, an insertion material with a refractive index different from the overcoat film is formed in the layer of the overcoat film at a position corresponding to the black matrix,
wherein the refractive index of the insertion material is different from the refractive index of the protective film.

11. An organic EL display device comprising:
a first substrate in which a protective film is formed so as to cover an organic EL layer; and
a second substrate in which a color filter is formed, a black matrix is formed between each of the color filters, and an overcoat film is formed so as to cover the color filter;
wherein an insertion material with a refractive index different from the overcoat film is formed in the layer of the overcoat film at a position corresponding to the black matrix, when seen from a direction perpendicular to the main surface of the second substrate,
wherein the refractive index of the insertion material is different from the refractive index of the protective film.

12. An organic EL display device according to claim 11, wherein the protective film is an adhesive material for bonding the first substrate to the second substrate.

* * * * *